United States Patent
Hirtzlin et al.

(10) Patent No.: US 7,230,484 B2
(45) Date of Patent: Jun. 12, 2007

(54) RF SIGNAL AMPLIFIER UNIT, RF SIGNAL TRANSMISSION DEVICE AND RF SIGNAL TRANSMITTING TERMINAL-ANTENNA

(75) Inventors: Patrice Hirtzlin, Betton (FR); Jean-Yves Le Naour, Pace (FR); Patrick Wurm, Cambridge (GB)

(73) Assignee: Thomson Licensing, Boulogne-Billancourt (FR)

( * ) Notice: Subject to any disclaimer, the term of this patent is extended or adjusted under 35 U.S.C. 154(b) by 139 days.

(21) Appl. No.: 10/333,320

(22) PCT Filed: Jul. 9, 2001

(86) PCT No.: PCT/FR01/02197

§ 371 (c)(1),
(2), (4) Date: Jan. 17, 2003

(87) PCT Pub. No.: WO02/09276

PCT Pub. Date: Jan. 31, 2002

(65) Prior Publication Data

US 2004/0012456 A1    Jan. 22, 2004

(51) Int. Cl.
*H03F 3/68* (2006.01)
(52) U.S. Cl. .................... 330/124 R; 330/107
(58) Field of Classification Search ................ 330/51, 330/107, 124 R, 129; 455/127.1, 128, 129
See application file for complete search history.

(56) References Cited

U.S. PATENT DOCUMENTS

| | | | |
|---|---|---|---|
| 4,596,047 A * | 6/1986 | Watanabe et al. ........... 455/281 |
| 5,256,987 A | 10/1993 | Kibayashi et al. .......... 330/295 |
| 5,831,479 A | 11/1998 | Leffel et al. ................ 330/124 |
| 6,201,440 B1 * | 3/2001 | Kobayashi .................... 330/51 |
| 6,214,987 B1 * | 4/2001 | Hiatt et al. ............... 455/127.3 |
| 6,288,606 B1 * | 9/2001 | Ekman et al. ................. 330/51 |

FOREIGN PATENT DOCUMENTS

EP        0982854       3/2000

* cited by examiner

Primary Examiner—Steven J. Mottola
(74) Attorney, Agent, or Firm—Joseph J. Laks; Robert D. Shedd; Brian J. Cromarty

(57) ABSTRACT

An RF signals amplification block receives a first RF signal, and comprises means of amplification of this first RF signal so as to deliver a second, amplified, RF signal. This signal must be amplified by a predetermined nominal power so as to be delivered at the output of the block. The block comprises means of measurement of the power of the second, amplified, RF signal, means of coupling the amplified RF signal to a first output of the block, a control signal generated by a central processing unit for controlling the coupling means. The invention also relates to an RF signals transmission device intended to be arranged at the focus of RF signals focusing means comprising a block according to the invention and an RF signals transmission antenna/terminal. Particular application to the tracking of nonsynchronous satellites.

5 Claims, 1 Drawing Sheet

RF SIGNAL AMPLIFIER UNIT, RF SIGNAL TRANSMISSION DEVICE AND RF SIGNAL TRANSMITTING TERMINAL-ANTENNA

This application claims the benefit, under 35 U.S.C. § 365 of International Application PCT/FR01/02197, filed Jul. 9, 2001, which was published in accordance with PCT Article 21(2) on Jan. 31, 2002 in French and which claims the benefit of French patent application No. 00/09571 filed Jul. 21, 2000.

BACKGROUND OF THE INVENTION

The present invention pertains to the field of telecommunications and relates more especially to an RF or radiofrequency signals amplification block.

1. Field of the Invention

The invention also relates to an RF signals transmission device intended to be arranged at the focus of RF signals focusing means, in particular but not exclusively of the type of a parabola or of a lens of Luneberg type.

2. Related Art

The invention also relates to an antenna/terminal comprising RF signals focusing means at the focus of which is arranged at least one device as cited hereinabove. It relates more especially but not exclusively to such a terminal comprising two devices as cited hereinabove for the tracking of targets, in particular of the nonsynchronous satellites type, just one of these two devices being intended to be active at a given instant.

Hitherto, commercial telecommunications via satellite have been achieved almost entirely via geostationary satellites, which are especially beneficial by virtue of their unchanging relative positions in the sky. However, the geostationary satellite exhibits major drawbacks such as considerable attenuations of the signals transmitted related to the distance separating the user antennas from the geostationary satellite (of the order of 36,000 kilometers, the corresponding losses then rising to around 205 dB in the Ku band) and transmission lags (typically of the order of 250 ms to 280 ms) thus becoming clearly perceivable and perturbing especially for real-time applications such as telephony, video conferencing, etc. Furthermore, the geostationary orbit, situated in the equatorial plane, poses a visibility problem in respect of the regions at high latitudes, the angles of elevation becoming very small for the regions close to the poles.

The alternatives to employing geostationary satellites are:
the use of satellites in inclined elliptical orbits, the satellite then being almost stationary above the region situated at the latitude of its apogee for a duration of possibly up to several hours,
the implementation of constellations of satellites in circular orbits, in particular in low orbit ("Low Earth Orbit" or LEO) or in mid-orbit ("Mid Earth Orbit" or MEO), the satellites of the constellation flying past in turn within visibility of the user terminal for a duration of from some ten minutes to around one hour.

In both cases, service cannot be provided permanently by a single satellite, continuity of service demanding that several satellites fly over the service area one after another.

An antenna/terminal as defined in the preamble makes it possible to ensure constant communication of the terminal in transmission with the constellation of nonsynchronous satellites.

Such a terminal usually comprises a parabola or a lens of Luneberg type at the focus of which are arranged two sources usually comprising radiating elements, of the type of arrays of "patches", horns or other radiating elements for transmitting RF signals. These elements are energized by an amplifier block making it possible to supply the source with an amplified signal. Upstream of this amplifier block is a central processing unit making it possible to manage the handovers between two successive low-orbit satellites in the radiation space. It is certain that a single source must be active at a given instant, except during handovers where the problem of the activation of the hitherto inactive source arises.

The role of the amplifier block is to amplify the signal enough to be able to be perceptible by the satellite. It must transmit at a nominal power predetermined by calculation of the satellite/terminal link budget. Specifically, if the transmission is carried out below the nominal power, the satellite recovers a low-level signal whereas if the transmission is performed above the value of the nominal power, the signal conveys distortions which may jam, at the satellite level, the reception of the information contained in the signal (in particular if the signal modulation performed is of the CDMA type).

The initialization of the inactive amplifier block going from the inactive state to the active state is carried out during handover. In the course of handover, the amplifier block must amplify to nominal power, doing so, from the first few milliseconds onwards, at the risk of losing the first few useful data items sent by the following satellite. Now, immediate or quasi-immediate transmission at nominal power during handover is difficult to regulate, due to factors which may cause the gain of the block to vary, such as component spread, variations in power supply, transmission frequencies, temperature, thermal resistance between the junction of a power transistor and the housing containing the amplifier, etc. If the effect due to spread of certain parameters can be reduced by factory calibration, there are others which are more difficult to control such as the junction temperature, making instantaneous regulation of the transmission power almost impossible with the accuracy required by the specifications of the satellite system. Therefore, the amplifier block takes a certain time before amplifying to the predetermined nominal power.

The invention aims to remedy the problems cited above.

SUMMARY OF THE INVENTION

For this purpose, the invention is an RF signals amplification block for cooperating with a central processing unit, comprising a first input for receiving a first RF signal, means of amplification of this first RF signal so as to deliver a second, amplified, RF signal, means of measurement of the power of the second, amplified, RF signal,
means of coupling the amplified RF signal to a first output of the block, a second input for receiving a control signal generated by the central processing unit so as to control the means of coupling as a function of the comparison between the power of the amplified RF signal and a nominal power value.

Thus, the block according to the invention outputs, during handover, a power signal going from a zero power to the predetermined nominal power.

In order for it to be possible to produce a block according to a mass production characterized by a modest cost requirement, the said block comprises two channels for processing the first RF signal, the amplification means comprising first and second amplification means arranged respectively on the first and the second processing channel so as each to deliver a third, amplified, RF signal of the same power, the said coupling means being able to receive at input the said third RF signals and to deliver on a second output of the first channel linked to the first output a difference signal corresponding to the difference of the said third signals and on a third output of the second channel a sum signal which corresponds to the sum of the third signals and is equivalent to the said second signal so as to be measured by the said means of measurement, the coupling means being able to permute the second and third outputs.

In this way, the invention makes it possible on the one hand to avoid the use of a per se expensive microwave frequency switch, on the other hand to use first and second amplification means which share the amplification function in an equal manner by operating in a parallel manner. Since they are required to amplify to half the power they have the advantages of being less expensive and easier to manufacture.

In order for the two amplification means to deliver signals of identical gains and phases so that the additive or differential combination of these signals are respectively constructive or destructive, the said processing channels comprise gain attenuation means and first means of phase-shifting of signals. In this way, the phase of the signal conveyed on the second channel is altered sufficiently to maximize the power produced.

According to one embodiment, the said block being required to amplify with large gain and to a high power level, at least one of the said first and second amplification means is preceded by a preamplifier usually called a "driver", and additionally, at least one of the first and second amplification means comprises a solid state power amplifier SSPA.

According to one embodiment, the said coupling means comprise a hybrid coupler. Thus, the very moderate loss of the hybrid coupler does not compel the overdimensioning of the point of compression of the SSPA.

According to one embodiment, one of the said channels comprises second means of 180° phase-shifting intended to be controlled by the said control means so as to carry out the said permutation of the delivery of the said signals. The said means of 180° phase-shifting are for example a low power level phase shifter.

According to a variant, the said coupling means comprise a microwave frequency switch.

The invention also relates to an RF signals transmission device intended to be arranged at the focus of RF signals focusing means, of the type of a parabola or of a lens of Luneberg type, characterized in that it comprises an amplification block according to the invention.

The invention also relates to an RF signals transmission antenna/terminal comprising RF signals focusing means at the focus of which is arranged at least one RF signals transmission device, characterized in that the said device comprises a device according to the invention.

BRIEF DESCRIPTION OF THE DRAWINGS

Other characteristics and advantages of the present invention will emerge from the description of the exemplary embodiments which follow, taken by way of nonlimiting examples, with reference to the appended figures in which.

To simplify the description, the same references will be used in the latter figures to designate the elements which fulfil identical functions.

DETAILED DESCRIPTION OF PREFERRED EMBODIMENTS

Patent applications Ser. No. 9,805,111 AND 9,805,112 which were filed on Apr. 23, 1998 in the name of the Applicant describe antenna/terminals for the tracking of nonsynchronous satellites along predefined trajectories. For example, in application Ser. No. 9,805,111, the antenna/terminal comprises at least first and second receiving/transmitting sources which can move along the focusing surface of the Luneberg lens along a line of focal points, the first source actively tracking a first satellite and the second source remaining on standby for active tracking of a second satellite. The signal transmission chain entails from the internal unit up to the external unit represented by the antenna/terminal a modulation carried out at the level of a modem, at least one transposition making it possible to transpose the signal to high frequencies (to Ku-bands for example for a low-orbit satellite constellation system), followed by an amplification with a large gain to a high power level.

Figure 1:
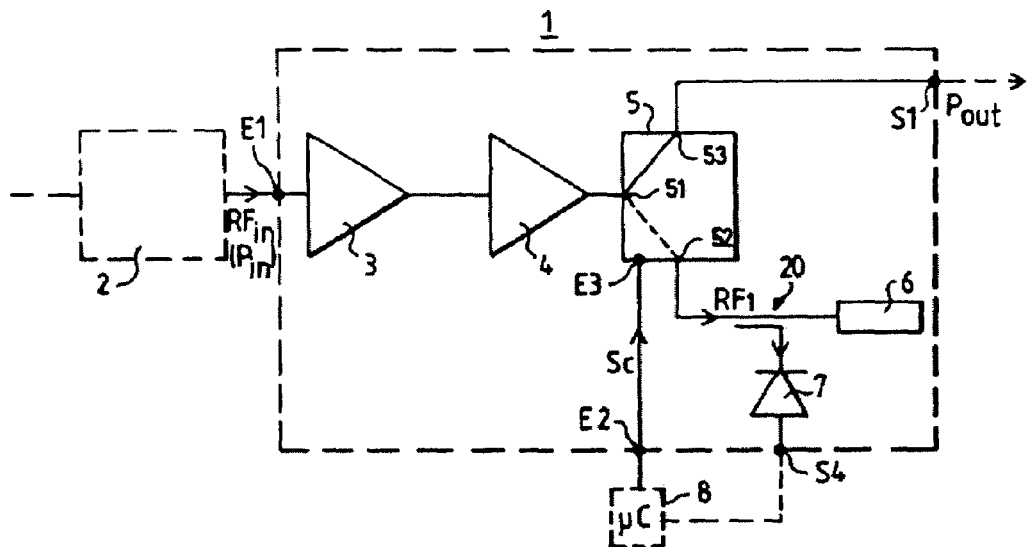
FIG. 1 illustrates a first embodiment of an amplification block according to the invention.

In FIG. 1, the amplification block 1 comprises a first input E1 receiving a signal RFin originating from a transposition block 2 which has transposed the input signal to Ku-band for example. The input E1 is linked to a preamplifier 3 whose output signal is itself amplified by an SSPA power amplifier 4. These two amplifiers are embodied in MMIC ("Microwave Monolithic Integrated Circuit") technology. The output of the second amplifier 4 is linked to a first connection terminal 51 of a microwave frequency breaker 5. A second connection terminal 52 links, by means of a coupler 20, the switch to a diode 7 for detection and for measurement (known per se) of the power of the output signal from the amplifier 4, the diode being linked to an output S4 of the block. The line linking the terminal 52 to the diode 7 is matched by a load impedance 6 of 50Ω. A third connection terminal 53 links the switch to an output S1 of the block 1. This output is linked to a source placed substantially at the focus of the antenna/terminal (not represented).

The handover instants are known to a central processing unit 8, for example a microcontroller 8 (disposed in the internal unit or in the antenna/terminal) by virtue of an ephemeris comprising the characteristics necessary for regulating the trajectories of the satellites of the constellation. Thus, in operational mode, for a handover at T0, the microcontroller estimates the new power Pout to be employed for transmitting the signal to the satellite (as a function of the new link budget which may be modified by the use of a new transmission frequency, for example. This information is transmitted in the signal transmitted by the satellite). Onwards of a certain time t1 prior to the instant of handover T0, the central processing unit causes a power signal Pin to be transmitted to the input E1 and sends a control signal Sc to an input E2 of the block linked to an input E3 of the switch so as to bring about the connection of the terminal 51 to the terminal 52. The output power from the amplifier 4 is then measured by the diode 7. This measurement is sent to the microcontroller which brings about the incrementation of the power signal Pin during the rise in the rating of this power. This power measurement and incrementation phase defines the block as being in an inactive state during which it cannot deliver any signal on its output S1.

When the power measured at the output of the amplifier 4 is then equal to the power Pout and the moment T0 is reached, the microcontroller 8 brings about via the signal Sc the connection of the terminal 51 to the terminal 53, thus linking the output of the amplifier 4 to the output S1.

The output power from the device 1 is then equal to the nominal value applied in order for the antenna to be able to transmit optimally. In this configuration, the block delivering a signal of optimal power Pout at its output S1 is in a so-called active state.

Figure 2:
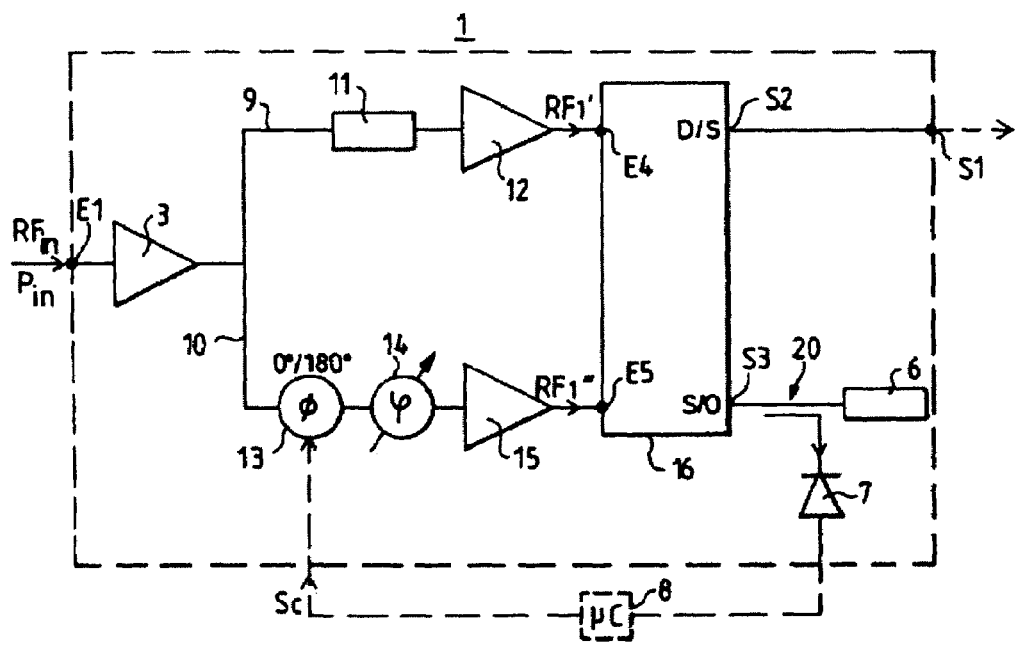
FIG. 2 illustrates a second embodiment of an amplification block according to the invention.

FIG. 2 represents another embodiment of the block 1 according to the invention. A first input E1 thereof is linked to a preamplifier 3, an output of which is linked to two parallel channels 9 and 10. Via the channel 2, the output of the amplifier 3 is linked to an input of a gain attenuator 11, an output of which feeds it to an input of a power amplifier 12. Via the channel 10, the output of the amplifier 3 is linked to the input of a phase shifter 13 able to phase-shift the signal at its input by 0° or 180°. The signal thus phase-shifted is then delivered to a phase-shifter 14 whose function is to alter the phase of the signal conveyed on this channel with that of the second channel. An output of this phase shifter is linked to an input of an amplifier 15. An output of each of the two amplifiers 12, 15 respectively delivers an amplified signal RF1', RF1" to a respective input E4, E5 of a hybrid coupler 16 which on a first S2 of its outputs delivers the difference of the signals RF1' and RF1" delivered by the two amplifiers and on a second S3 of the outputs of the coupler 16 delivers the sum of these signals RF1' and RF1". The latter output S3, stub-matched by a load impedance 6 of 50 Ω, is also linked to a diode 7 for measuring the power of the sum signal leaving S3. This diode 7 delivers a measurement signal to the output S4 linked to a microcontroller 8.

In order for the block to operate satisfactorily, it is necessary for the two amplifiers to exhibit an identical gain and an identical phase so that their respective output signals are constructive. This is achieved by virtue of the attenuator 11 and of the phase shifter 14 which are factory-adjusted.

The initialization phase of the procedure for slaving the transmission power is triggered as soon as the microprocessor receives the order to prepare itself to manage a handover (for example via an indicative word in the signal received from the satellite and/or by virtue of the ephemeris).

As long as the signal at the output S3 does not transmit a predetermined nominal power, the microcontroller increments the input power Pin according to means known per se. Once a threshold value of measurement of power of the sum signal is reached, for example: "Pout minus 20 dB", the microcontroller determines the corresponding input power Pin, and, the gain of the chain being substantially constant, it then determines the new input power Pin to be transmitted to the input E1 of the block so that the amplification chain should transmit at the output of the amplifier 15 a power Pout equal to the nominal power required (the relation between the input power and the output power of the chain being linear).

Once the power Pout is reached at the output S3, the microcontroller waits for the order signal at the instant T0 of actual handover so as to send the command to the phase shifter 13 to invert the phase of the signal travelling through the second channel so as to invert the outputs of the hybrid coupler. In this way, all of the power is then directed to the output S1 intended for the source.

The block according to the invention thus makes it possible to calibrate the power supplied to the source with no risk of losing useful data during handover, guaranteeing that the first few useful data items transmitted will be so at the required nominal power.

The use of two SSPA amplifiers instead of just one makes it possible to reduce the output power of each of them by three decibels and their compression point correspondingly. The cost of the amplification chain of the terminal is thereby decreased and its reliability increased. Moreover, the 180° switching phase-shifter is an element operating at low power level whose level scarcely influences the amplification chain since SSPA amplifiers, often in MMIC technology and having several stages, provide a large gain predominant over the level of the phase-shifter.

Of course, the invention is not limited to the embodiments described above. Thus, the block according to the invention can have the role of amplification for any type of terminal which is required to generate a nominal power at a given instant. Likewise, the terminal is not limited to the tracking of moving targets such as presented in the introduction of the present patent application. The block can for example be disposed in an antenna/terminal for communication with a geostationary satellite, its role being here again to amplify at a given instant an unamplified signal to the required nominal power, allowing the transmission of a signal with no loss of useful data.

The invention claimed is:

1. RF signals amplification block for cooperating with a central processing unit, wherein said block comprises two channels for processing the first RF signal, said block comprising:
   means for amplifying a first RF signal, comprising first and second amplification means arranged respectively on the first and second processing channel so as each to deliver a third, amplified, RF signal of the same power,
   means for measuring the power of the third, amplified, RF signal,
   means for coupling the third amplified RF signals and being able to deliver on a second output a difference signal corresponding to the difference of said third signals and on a third output a sum signal corresponding to the sum of the third signals to a first output of the block as to deliver a second, amplified, RF signal or a signal to the means for measuring, depending of a control signal generated by the central processing unit as a function of the comparison between the power of the amplified RF signal and a nominal power value, the coupling means being associated with means to permute the second and third outputs.

2. Block according to claim 1, wherein said processing channels comprise gain attenuation means and first means of phase-shifting of signals.

3. Block according to claim 1, wherein at least one of the first and second amplification means comprises a solid state power amplifier SSPA.

4. Block according to claim 1, wherein the said coupling means comprise a hybrid coupler.

5. Block according to claim 1, wherein one of said channels comprises second means of 180° phase-shifting intended to be controlled by said control means so as to carry out said permutation of the delivery of said signals.

* * * * *